United States Patent
Ma et al.

(10) Patent No.: US 10,503,029 B2
(45) Date of Patent: Dec. 10, 2019

(54) DISPLAY PANEL AND PIXEL STRUCTURE THEREOF

(71) Applicant: Wuhan China Star Optoelectronics Technology Co., Ltd., Wuhan, Hubei (CN)

(72) Inventors: Liang Ma, Guangdong (CN); Wei-Ping Yeh, Guangdong (CN); Jun Xia, Guangdong (CN); Cong Wang, Guangdong (CN); Lifang Wang, Guangdong (CN)

(73) Assignee: Wuhan China Star Optoelectronics Technology Co., Ltd, Wuhan, Hubei (CN)

( * ) Notice: Subject to any disclaimer, the term of this patent is extended or adjusted under 35 U.S.C. 154(b) by 0 days.

(21) Appl. No.: 15/552,490

(22) PCT Filed: May 25, 2017

(86) PCT No.: PCT/CN2017/085844
§ 371 (c)(1),
(2) Date: Aug. 21, 2017

(87) PCT Pub. No.: WO2018/196073
PCT Pub. Date: Nov. 1, 2018

(65) Prior Publication Data
US 2018/0314116 A1    Nov. 1, 2018

(30) Foreign Application Priority Data

Apr. 27, 2017    (CN) .......................... 2017 1 0287930

(51) Int. Cl.
*G02F 1/1343*    (2006.01)
*H01L 27/12*    (2006.01)
(Continued)

(52) U.S. Cl.
CPC .. *G02F 1/134309* (2013.01); *G02F 1/136209* (2013.01); *G02F 1/136227* (2013.01);
(Continued)

(58) Field of Classification Search
CPC ......... G02F 1/134309; G02F 1/136209; G02F 1/136286; G02F 1/136227; G02F 1/1368;
(Continued)

(56) References Cited

U.S. PATENT DOCUMENTS 7,230,667 B2    6/2007 Shin et al.
7,714,970 B2    5/2010 Kim et al.
(Continued)

FOREIGN PATENT DOCUMENTS

CN    102645781 A    8/2012
CN    104701354 A    6/2015
CN    105185244 A    12/2015

*Primary Examiner* — Charles S Chang
(74) *Attorney, Agent, or Firm* — Andrew C. Cheng

(57) ABSTRACT

The disclosure discloses a pixel structure. The pixel structure at least includes a first pixel electrode and a second pixel electrode disposed adjacently. The first pixel electrode includes a first effective display section and a first ineffective display section. The second pixel electrode includes a second effective display section and a second ineffective display section. A display area of the first effective display section is smaller than a display area of the second effective display section. A ratio of an actual coverage area of the second pixel electrode to an actual coverage area of the first pixel electrode is in a range of 1~2/3.

15 Claims, 3 Drawing Sheets

(51) Int. Cl.
*H01L 29/786* (2006.01)
*G02F 1/1362* (2006.01)
*G02F 1/1368* (2006.01)

(52) U.S. Cl.
CPC ...... *G02F 1/136286* (2013.01); *H01L 27/124* (2013.01); *H01L 27/1222* (2013.01); *H01L 29/78633* (2013.01); *H01L 29/78675* (2013.01); *G02F 1/1368* (2013.01); *G02F 2201/121* (2013.01)

(58) Field of Classification Search
CPC ........... G02F 2201/121; H01L 27/1222; H01L 27/124; H01L 29/78675; H01L 29/78633
USPC ........................................................ 349/144
See application file for complete search history.

(56) References Cited

U.S. PATENT DOCUMENTS

| | | |
|---|---|---|
| 9,746,735 B2 | 8/2017 | Lee et al. |
| 9,825,064 B2 | 11/2017 | Dong et al. |
| 9,989,823 B2 | 6/2018 | Jin |
| 10,025,416 B2 | 7/2018 | Jin et al. |
| 10,241,368 B2 | 3/2019 | Jin |
| 2014/0354520 A1 | 12/2014 | Sato et al. |
| 2015/0109565 A1* | 4/2015 | Takeda .............. G02F 1/134309 349/106 |
| 2016/0178981 A1* | 6/2016 | Lee .................. G02F 1/136213 257/71 |
| 2018/0005594 A1* | 1/2018 | Takeuchi ............. G09G 3/3677 |

\* cited by examiner

DISPLAY PANEL AND PIXEL STRUCTURE THEREOF

FIELD OF THE DISCLOSURE

The disclosure relates to a display technical field, and more particularly to a display panel and a pixel structure thereof.

BACKGROUND

With the gradual variation of display panels, people have increasing demands for mobile phones. In order to be capable of meeting requirements of the public, panel manufacturers have made various adjustments on the design of panels, such as adjusting the design to reduce the power consumption of panels, adjusting the color block material to increase the display effect of the panel, etc. In the design of reducing the power consumption of panels, the driving thin film transistor (TFT) of the gate driver on array (GOA) can be reduced or the design of pixels can be changed. The WRGB panel design is generated accordingly. The WRGB pixel design can be chosen to reduce the power consumption of panels, so as to cut down the power consumption of panels in electrical devices such as mobile phones, computers, etc. But compared with RGB display panels, while panels of the WRGB pixel design display the pure color or colorful images, under the same background, the pure color brightness will be lower, and the displayed images will be distorted, which will destroy the optical quality of images severely.

SUMMARY

The disclosure provides a display panel and a pixel structure thereof, which can enhance the display effect and ensure the stability of the display panel simultaneously.

In order to solve the technical problem above, the disclosure provides a pixel structure. The pixel structure at least includes a first pixel electrode and a second pixel electrode disposed adjacently. The first pixel electrode includes a first effective display section and a first ineffective display section. The second pixel electrode includes a second effective display section and a second ineffective display section. A display area of the first effective display section is smaller than a display area of the second effective display section. A ratio of an actual coverage area of the second pixel electrode to an actual coverage area of the first pixel electrode is in a range of 1~2/3. The first ineffective display section is a section of the first pixel electrode sheltered by a black matrix. The second ineffective display section is a section of the second pixel electrode sheltered by the black matrix. The first pixel electrode is a white pixel electrode. The second pixel electrode is a red pixel electrode, a blue pixel electrode or a green pixel electrode.

In order to solve the technical problem above, the disclosure further provides a pixel structure. The pixel structure at least includes a first pixel electrode and a second pixel electrode disposed adjacently. The first pixel electrode includes a first effective display section and a first ineffective display section. The second pixel electrode includes a second effective display section and a second ineffective display section. A display area of the first effective display section is smaller than a display area of the second effective display section. A ratio of an actual coverage area of the second pixel electrode to an actual coverage area of the first pixel electrode in a range of 1~2/3.

In order to solve the technical problem above, the disclosure still provides a display panel, including a first substrate, a second substrate, a liquid crystal layer disposed between the first substrate and the second substrate, a pixel structure disposed on the first substrate, and a common electrode layer disposed on the first substrate. The common electrode layer is disposed separately from the pixel structure in a direction of a thickness of the liquid crystal display panel. The pixel structure at least includes a first pixel electrode and a second pixel electrode disposed adjacently. The first pixel electrode includes a first effective display section and a first ineffective display section. The second pixel electrode includes a second effective display section and a second ineffective display section. A display area of the first effective display section is smaller than a display area of the second effective display section. A ratio of an actual coverage area of the second pixel electrode to an actual coverage area of the first pixel electrode in a range of 1~2/3.

Beneficial effects of the disclosure are distinguishing from the prior art, according to the disclosure, the display area of the first effective display section is smaller than the display area of the second effective display section. The ratio of display of the second pixel electrode can be increased to reduce the distortion of colorful images and enhance the optical taste of colorful images. The ratio of an actual coverage area of the second pixel electrode to an actual coverage area of the first pixel electrode is in a range of 1~2/3, which can make the storage capacitance difference between the storage capacitance corresponding to the first pixel electrode and the storage capacitance corresponding to the second pixel electrode to be little, further preventing phenomena such as electrical leakage, crosstalk, blink, etc., in order to improve the stability of the display panel.

DETAILED DESCRIPTION OF PREFERRED EMBODIMENTS

Embodiments of the disclosure will be described in detail with reference to the accompanying drawings as follows.

Figure 1:
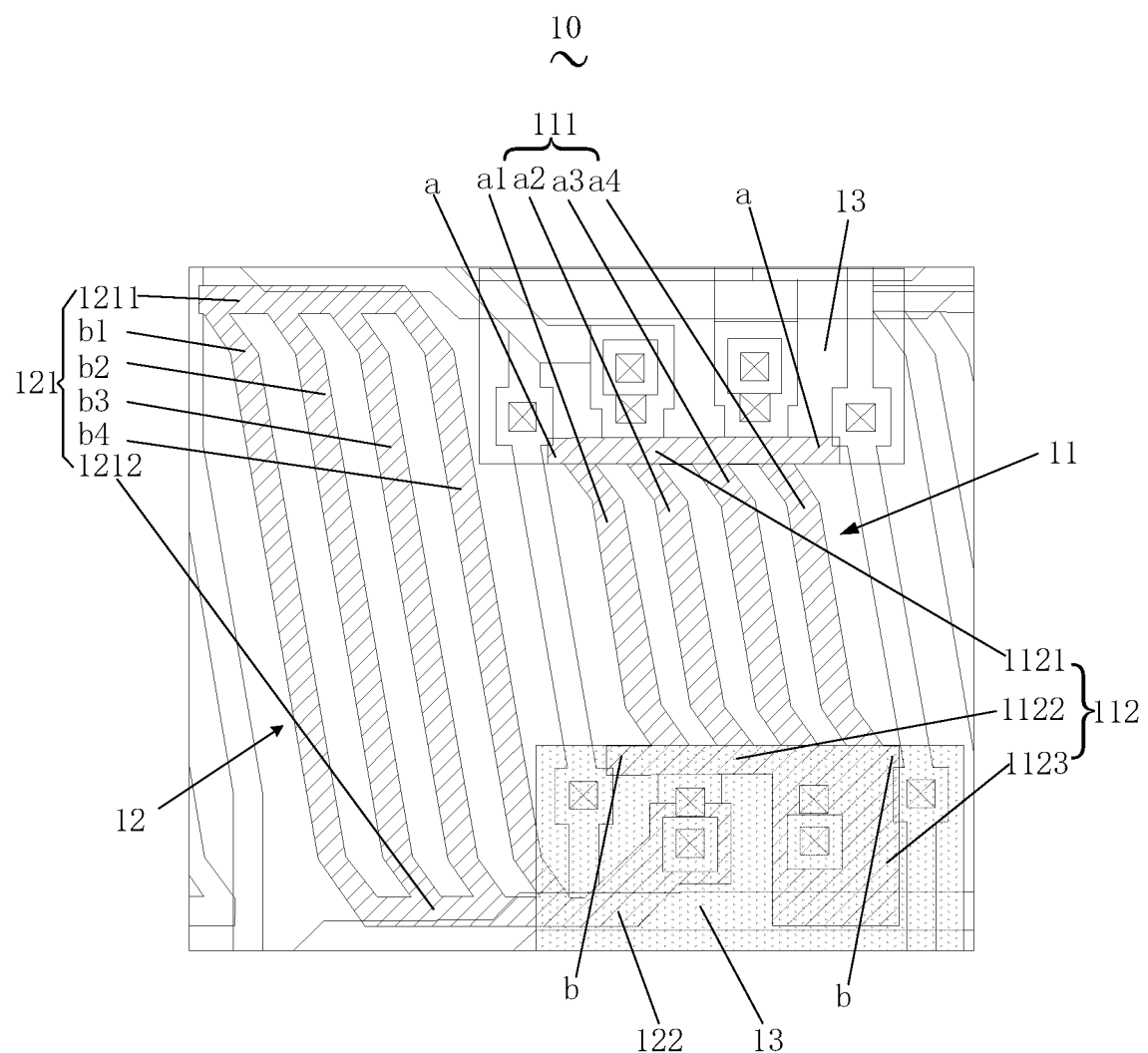
FIG. 1 is a structural schematic view of a pixel structure according to an embodiment of the disclosure.

Referring to FIG. 1, FIG. 1 is a structural schematic view of a pixel structure according to an embodiment of the disclosure. In the embodiment, the pixel structure at least can include a first pixel electrode 11 and a second pixel electrode 12 disposed adjacently.

For instance, the first pixel electrode 11 can be a white pixel electrode. The second pixel electrode 12 can be a red pixel electrode, a blue pixel electrode or a green pixel electrode.

The first pixel electrode 11 includes a first effective display section 111 and a first ineffective display section 112.

The second pixel electrode 12 includes a second effective display section 121 and a second ineffective display section 122.

The first ineffective display section 112 is a section of the first pixel electrode 11 sheltered by a black matrix 13. The first effective display section 111 is a section of the first pixel electrode 11 unsheltered by the black matrix 13. The second ineffective display section 122 is a section of the second pixel electrode 12 sheltered by the black matrix 13. The second effective display section 121 is a section of the second pixel electrode 12 unsheltered by the black matrix 13.

A display area of the first effective display section 111 is smaller than a display area of the second effective display section 121. The display area of the first effective display section 111 indicates an area of a region limited by the outline of the first effective display section 111. The display area of the second effective display section 121 indicates an area of a region limited by the outline of the second effective display section 121. For instance, the display area of the first effective display section 111 includes an area of a hollow region in the middle of the first effective display section 111 and an actual coverage area of the first effective display section 111. The actual coverage area indicates a coverage area of a section of an actual object without the hollow region. Relative noun definitions in the following are similar.

A ratio of an actual coverage area of the second pixel electrode 12 to an actual coverage area of the first pixel electrode 11 is in a range of 1~2/3. The actual coverage area of the first pixel electrode 11 indicates a sum of the actual coverage areas of the first effective display section 111 and the first ineffective display section 112. The actual coverage area of the second pixel electrode 12 indicates a sum of the actual coverage areas of the second effective display section 121 and the second ineffective display section 122.

In an embodiment, a difference of the actual coverage area of the second pixel electrode 12 and the actual coverage area of the first pixel electrode 11 is 0, which means the actual coverage area of the second pixel electrode 12 and the actual coverage area of the first pixel electrode 11 are equal.

In an embodiment, an area of the first ineffective display section 112 is larger than an area of the second ineffective display section 122.

The first effective display section 111 includes a plurality of first wire gatings a1, a2, a3, a4 disposed separately.

The first ineffective display section 112 includes a first connecting section 1121 connected with one end of the plurality of first wire gatings a1, a2, a3, a4 (e.g. a top end in FIG. 1), a second connecting section 1122 connected with the other end of the plurality of first wire gatings a1, a2, a3, a4 (e.g. a bottom end in FIG. 1), and a first pin section 1123 connected with the second connecting section 1122.

The second effective display section 121 includes a plurality of second wire gatings b1, b2, b3, b4 disposed separately, a third connecting section 1211 connected with one end of the plurality of second wire gatings b1, b2, b3, b4 (e.g. a top end in FIG. 1), and a fourth connecting section 1212 connected with the other end of the plurality of second wire gatings b1, b2, b3, b4 (e.g. a bottom end in FIG. 1).

The second ineffective display section 122 is a second pin section connected with the fourth connecting section 1212.

The first connecting section 1121 has first extension sections as that exceed the external edges of the outermost first wire gatings a1 and a4 (e.g. the right side of the rightmost first wire gating a4 in FIG. 1 and the left side of the leftmost first wire gating a1 in FIG. 1). The second connecting section 1121 can have second extension sections bs that exceed the external edges of the outermost first wire gatings a1 and a4.

An area of the first pin section 1123 can be larger than an area of the second pin section.

The first pin section 1123 can be configured to connect to a drain electrode or a source electrode of the corresponding thin film transistor.

The second pin section can be configured to connect to the drain electrode or the source electrode of the corresponding thin film transistor.

The number of the first wire gatings a1, a2, a3, a4 can be equal to the number of the second wire gatings b1, b2, b3, b4. Lengths of each of the first wire gatings a1, a2, a3, a4 can be mutually identical. Lengths of each of the second wire gatings b1, b2, b3, b4 can be mutually identical. Widths of each of the first wire gatings a1, a2, a3, a4 can be mutually identical. Widths of each of the second wire gatings b1, b2, b3, b4 can be mutually identical. The width of the first wire gatings a1, a2, a3, a4 can be equal to the width of the second wire gatings b1, b2, b3, b4. The length of the first wire gatings a1, a2, a3, a4 can be larger than the length of the second wire gatings b1, b2, b3, b4.

According to the embodiment, the display area of the first effective display section 111 is smaller than the display area of the second effective display section 121. The ratio of display of the second pixel electrode 12 (e.g. the red pixel electrode, the blue pixel electrode or the green pixel electrode) can be increased to reduce the distortion of colorful images and enhance the optical taste of colorful images. On the basis, the area of the first pin section 1123 is increased by adding the first extension section as and the second extension section bs, so that the area of the first ineffective display section 112 is larger than the area of the second ineffective display section 122, leading to reduce the difference of the actual coverage area of the second pixel electrode 12 and the actual coverage area of the first pixel electrode 11, further resulting in the reduced difference of the storage capacitance corresponding to the first pixel electrode and the storage capacitance corresponding to the second pixel electrode, which can prevent phenomena such as electrical leakage, crosstalk, blink, etc., in order to improve the stability of the display panel.

Figure 2:
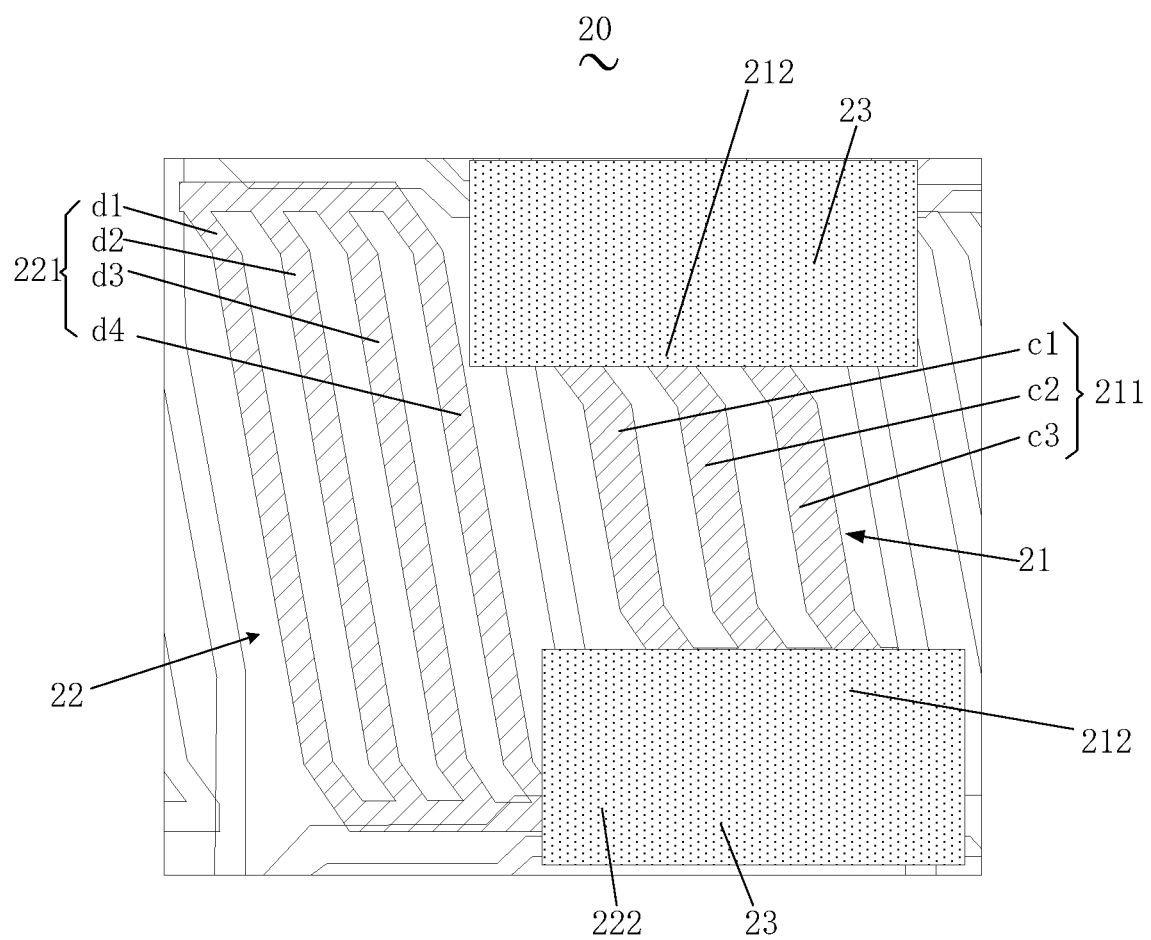
FIG. 2 is a structural schematic view of a pixel structure according to another embodiment of the disclosure.

Referring to FIG. 2, FIG. 2 is a structural schematic view of a pixel structure according to another embodiment of the disclosure. In the embodiment, a pixel structure 20 can at least include a first pixel electrode 21 and a second pixel electrode 22 disposed adjacently.

For instance, the first pixel electrode 21 can be a white pixel electrode. The second pixel electrode 22 can be a red pixel electrode, a blue pixel electrode or a green pixel electrode.

The first pixel electrode 21 can include a first effective display section 211 and a first ineffective display section 212.

The second pixel electrode 22 can include a second effective display section 221 and a second ineffective display section 222.

The first ineffective display section 212 can be a section of the first pixel electrode 21 sheltered by a black matrix 23. The first effective display section 211 can be a section of the first pixel electrode 21 unsheltered by the black matrix 23. The second ineffective display section 222 can be a section of the second pixel electrode 22 sheltered by the black matrix 23. The second effective display section 221 can be a section of the second pixel electrode 22 unsheltered by the black matrix 23.

A display area of the first effective display section 211 is smaller than a display area of the second effective display section 221.

A ratio of an actual coverage area of the second pixel electrode 22 to an actual coverage area of the first pixel electrode 21 is in a range of 1~2/3.

In an embodiment, a difference of the actual coverage area of the second pixel electrode 22 and the actual coverage area of the first pixel electrode 21 is 0, which means the actual coverage area of the second pixel electrode 22 and the actual coverage area of the first pixel electrode 21 are equal.

The first effective display section 211 can include a plurality of third wire gatings c1, c2, c3 disposed separately. The second effective display section 221 can include a plurality of fourth wire gatings d1, d2, d3, d4 disposed separately. The number of the third wire gatings c1, c2, c3 can be less than the number of the fourth wire gatings d1, d2, d3, d4. Widths of each of the third wire gatings c1, c2, c3 can be mutually identical. Widths of each of the fourth wire gatings d1, d2, d3, d4 can be mutually identical. The width of the third wire gatings c1, c2, c3 can be more than the width of the fourth wire gatings d1, d2, d3, d4.

Furthermore, the area of the first ineffective display section 212 can be larger than the area of the second ineffective display section 222. The specific disposition of the area of the first ineffective display section 212 is larger than the area of the second ineffective display section 222 can be referred to the description above, which will not be repeated. In other embodiments, the area of the first ineffective display section 212 can also be smaller than or equal to the area of the second ineffective display section 222. The ratio of the actual coverage area of the second pixel electrode 22 to the actual coverage area of the first pixel electrode 21 is in a range of 1~2/3 can be achieved by merely altering the number relation and the width relation of the third wire gatings c1, c2, c3 and the fourth wire gatings d1, d2, d3, d4.

According to the embodiment, the display area of the first effective display section 211 is smaller than the display area of the second effective display section 221. The ratio of display of the second pixel electrode 22 (e.g. the red pixel electrode, the blue pixel electrode or the green pixel electrode) can be increased to reduce the distortion of colorful images and enhance the optical taste of colorful images. On the basis, the difference of the actual coverage area of the second pixel electrode 22 and the actual coverage area of the first pixel electrode 21 is decreased by making the number of the third wire gatings c1, c2, c3 to be less than the number of the fourth wire gatings d1, d2, d3, d4 and the width of the third wire gatings c1, c2, c3 to be more than the width of the fourth wire gatings d1, d2, d3, d4, so as to reduce the difference of the actual coverage area of the second pixel electrode 22 and the actual coverage area of the first pixel electrode 21, further resulting in the reduced difference of the storage capacitance corresponding to the first pixel electrode 21 and the storage capacitance corresponding to the second pixel electrode 22, which can prevent phenomena such as electrical leakage, crosstalk, blink, etc., in order to improve the stability of the display panel.

Figure 3:
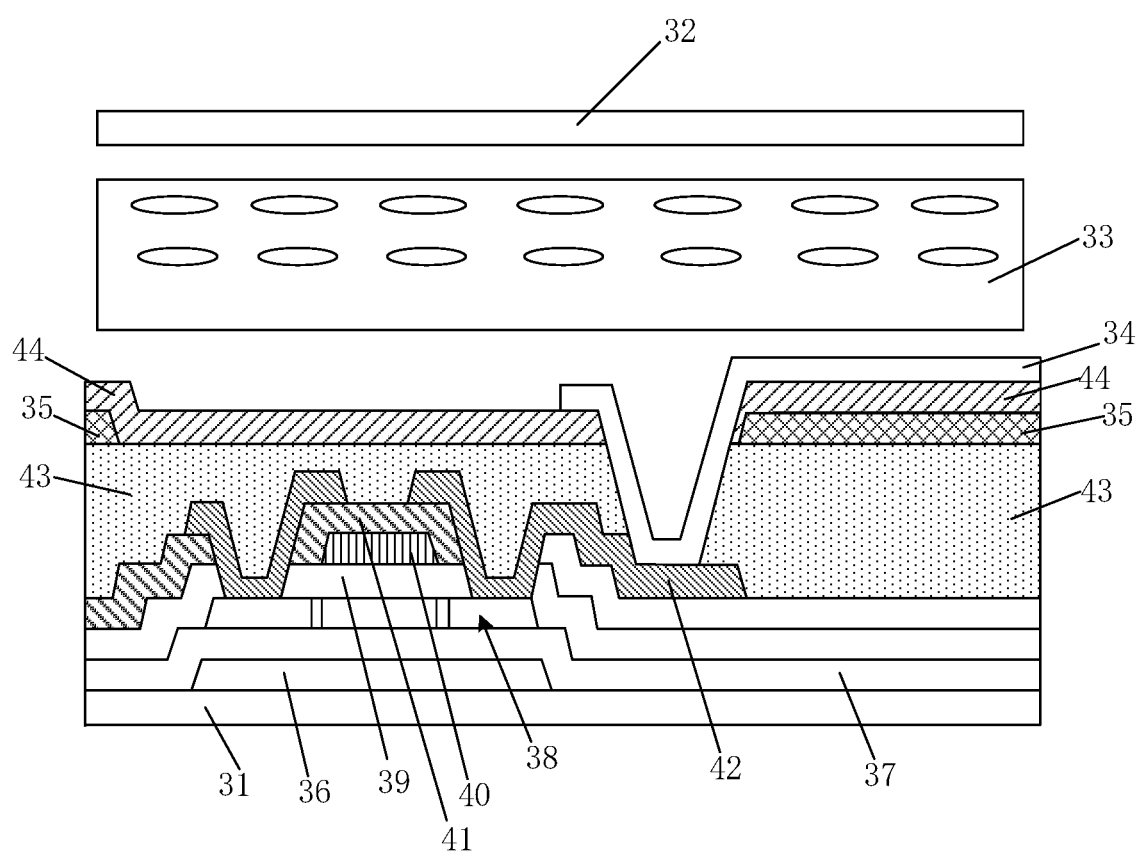
FIG. 3 is a structural schematic view of a display panel according to an embodiment of the disclosure.

Referring to FIG. 3, FIG. 3 is a structural schematic view of a display panel according to an embodiment of the disclosure. In the embodiment, the display panel can include a first substrate 31, a second substrate 32, a liquid crystal layer 33 disposed between the first substrate 31 and the second substrate 32, a pixel structure 34 disposed on the first substrate 31, and a common electrode layer 35 disposed on the first substrate 31. The common electrode layer 35 is disposed separately from the pixel structure 34 in a direction of a thickness of the liquid crystal display panel.

The pixel structure 34 is the pixel structure in any embodiment above, which will not be repeated. Only one pixel electrode of the pixel structure is shown in FIG. 3, such as the first pixel electrode or the second pixel electrode. It is understandable to a person skilled in the art that the pixel structure in the previously described embodiments is formed by combination with the adjacent pixel electrodes In an embodiment, the display panel can further include a shelter layer 36 disposed on the first substrate 31, a buffer layer 37 disposed on the shelter layer 36 and the first substrate 31, a polysilicon semiconductor layer 38 disposed on the buffer layer 37, a gate insulating layer 39 disposed on the polysilicon semiconductor layer 38, a gate layer 40 disposed on the gate insulating layer 39, an interlayered insulating layer 41 disposed on the gate layer 40, a drain source layer 42 disposed on the interlayered insulting layer 41, a planarization layer 43 disposed on the drain source layer 42, the common electrode layer 35 disposed on the planarization layer 43, a passivation layer 44 disposed on the common electrode layer 35, the pixel structure 34 disposed on the passivation layer 44. The projection of the pixel structure 34 on the common electrode layer 35 is covered by the common electrode layer 35. The gate layer 40 and the drain source layer 42 form the thin film transistor structure.

The pixel structure 37 is the pixel electrode layer. The pixel electrode layer and the drain source layer 42 are electrically connected through a via hole.

In an embodiment, the display panel can likewise include a black matrix and a color filter disposed on the second substrate 32.

The description above is merely an example of the display panel. The display panel can adopt display panels with other display principles, which will not be restricted by the embodiments of the disclosure. The display panel can include other film layers or elements as well, which will not be illustrated exhaustively.

During the operation of the display panel, the first storage capacitance can be generated between the first pixel electrode and the common electrode layer of the pixel structure. The second storage capacitance can be generated between the second pixel electrode and the common electrode layer of the pixel structure. As the ratio of an actual coverage area of the second pixel electrode to an actual coverage area of the first pixel electrode is in a range of 1~2/3, the difference between the first storage capacitance and the second storage capacitance can be small, which will not cause phenomena such as electrical leakage, crosstalk, blink, etc., in order to improve the stability of the display panel.

According to the embodiments of the disclosure, the display area of the first effective display section is smaller than the display area of the second effective display section. The ratio of display of the second pixel electrode can be increased to reduce the distortion of colorful images and enhance the optical taste of colorful images. The ratio of an actual coverage area of the second pixel electrode to an actual coverage area of the first pixel electrode is in a range of 1~2/3, which can make the storage capacitance difference between the storage capacitance corresponding to the first pixel electrode and the storage capacitance corresponding to the second pixel electrode to be little, further preventing phenomena such as electrical leakage, crosstalk, blink, etc., in order to improve the stability of the display panel.

The description above is merely embodiments of the disclosure, which cannot limit the protection scope of the disclosure. Any equivalent structure or process according to contents of the disclosure and the figures, or direct or indirect application in other related fields should be included in the protected scope of the disclosure.

What is claimed is:

1. A pixel structure, the pixel structure at least comprising a first pixel electrode and a second pixel electrode disposed adjacently, the first pixel electrode comprising a first effective display section and a first ineffective display section, the second pixel electrode comprising a second effective display section and a second ineffective display section, a display area of the first effective display section being smaller than a display area of the second effective display section, a ratio of an actual coverage area of the second pixel electrode to an actual coverage area of the first pixel electrode in a range of 1~2/3, the first ineffective display section being a section of the first pixel electrode sheltered by a black matrix, the second ineffective display section being a section of the second pixel electrode sheltered by the black matrix, the first pixel electrode being a white pixel electrode, the second pixel electrode being a red pixel electrode, a blue pixel electrode or a green pixel electrode;

wherein an area of the first ineffective display section is larger than an area of the second ineffective display section;

wherein the first effective display section comprises a plurality of first wire gatings disposed separately; and the second effective display section comprises a plurality of second wire gatings disposed separately, a third connecting section connected with one end of the plurality of second wire gatings, and a fourth connecting section connected with the other end of the plurality of second wire gatings;

wherein the first ineffective display section comprises a first connecting section connected with one end of the plurality of first wire gatings, a second connecting section connected with the other end of the plurality of first wire gatings, and a first pin section connected with the second connecting section; and the second ineffective display section is a second pin section connected with the fourth connecting section;

wherein the first connecting section has a first external edge and a second external edge opposite to the first external edge; the second connecting section has a third external edge and a fourth external edge opposite to the third external edge; the first connecting section has a first extension section extending along the first connecting section from the first external edge, and is located outer a position that the outermost first wire gating located on the first external edge; the first connecting section has a second extension section extending along the first connecting section from the second external edge, and is located outer a position that the outermost first wire gating located on the second external edge; the second connecting section has a third extension section extending along the second connecting section from the third external edge, and is located outer a position that the outermost first wire gating located on the third external edge; and the second connecting section has a fourth extension section extending along the second connecting section from the fourth external edge, and is located outer a position that the outermost first wire gating located on the fourth external edge;

wherein the first extension section, the second extension section, the third extension section, and the fourth extension section are fully covered by the black matrix.

2. The pixel structure according to claim 1, wherein the number of the first wire gatings is less than the number of the second wire gatings, a width of the first wire gatings is larger than a width of the second wire gatings.

3. The pixel structure according to claim 1, wherein the actual coverage area of the first pixel electrode is a sum of the actual coverage areas of the first effective display section and the first ineffective display section; and the actual coverage area of the second pixel electrode is a sum of the actual coverage areas of the second effective display section and the second ineffective display section.

4. The pixel structure according to claim 1, wherein the first connecting section, the first extension section, and the second extension section are integrated into a rectangle shape.

5. The pixel structure according to claim 1, wherein the second connecting section, the third extension section, and the fourth extension section are integrated into a rectangle shape.

6. A pixel structure, the pixel structure at least comprising a first pixel electrode and a second pixel electrode disposed adjacently, the first pixel electrode comprising a first effective display section and a first ineffective display section, the second pixel electrode comprising a second effective display section and a second ineffective display section, a display area of the first effective display section being smaller than a display area of the second effective display section, a ratio of an actual coverage area of the second pixel electrode to an actual coverage area of the first pixel electrode in a range of 1~2/3, wherein the first pixel electrode is a white pixel electrode, and the second pixel electrode is a red pixel electrode, a blue pixel electrode or a green pixel electrode;

wherein an area of the first ineffective display section is larger than an area of the second ineffective display section;

wherein the first ineffective display section is a section of the first pixel electrode sheltered by a black matrix, the first effective display section is a section of the first pixel electrode unsheltered by the black matrix, the second ineffective display section is a section of the second pixel electrode sheltered by the black matrix, and the second effective display section is a section of the second pixel electrode unsheltered by the black matrix;

wherein the first effective display section comprises a plurality of first wire gatings disposed separately; and the second effective display section comprises a plurality of second wire gatings disposed separately, a third connecting section connected with one end of the plurality of second wire gatings, and a fourth connecting section connected with the other end of the plurality of second wire gatings;

wherein the first ineffective display section comprises a first connecting section connected with one end of the plurality of first wire gatings, a second connecting section connected with the other end of the plurality of first wire gatings, and a first pin section connected with the second connecting section; and the second ineffective display section is a second pin section connected with the fourth connecting section;

wherein the first connecting section has a first external edge and a second external edge opposite to the first external edge; the second connecting section has a third external edge and a fourth external edge opposite to the third external edge; the first connecting section has a first extension section extending along the first connecting section from the first external edge, and is located outer a position that the outermost first wire gating located on the first external edge; the first connecting section has a second extension section extending along the first connecting section from the second external edge, and is located outer a position that the outermost first wire gating located on the second external edge; the second connecting section has a third extension section extending along the second connecting section from the third external edge, and is located outer a position that the outermost first wire gating located on the third external edge; and the second connecting section has a fourth extension section extending along the second connecting section from the fourth external edge, and is located outer a position that the outermost first wire gating located on the fourth external edge;

wherein the first extension section, the second extension section, the third extension section, and the fourth extension section are fully covered by the black matrix.

7. The pixel structure according to claim 6, wherein the number of the first wire gatings is less than the number of the second wire gatings, a width of the first wire gatings is larger than a width of the second wire gatings.

8. The pixel structure according to claim 6, wherein the actual coverage area of the first pixel electrode is a sum of the actual coverage areas of the first effective display section and the first ineffective display section; and the actual coverage area of the second pixel electrode is a sum of the actual coverage areas of the second effective display section and the second ineffective display section.

9. The pixel structure according to claim 6, wherein the first connecting section, the first extension section, and the second extension section are integrated into a rectangle shape.

10. The pixel structure according to claim 6, wherein the second connecting section, the third extension section, and the fourth extension section are integrated into a rectangle shape.

11. A display panel, the display panel comprising a first substrate, a second substrate, a liquid crystal layer disposed between the first substrate and the second substrate, a pixel structure disposed on the first substrate, and a common electrode layer disposed on the first substrate, the common electrode layer disposed separately from the pixel structure in a direction of a thickness of the liquid crystal display panel, the pixel structure at least comprising a first pixel electrode and a second pixel electrode disposed adjacently, the first pixel electrode comprising a first effective display section and a first ineffective display section, the second pixel electrode comprising a second effective display section and a second ineffective display section, a display area of the first effective display section being smaller than a display area of the second effective display section, a ratio of an actual coverage area of the second pixel electrode to an actual coverage area of the first pixel electrode in a range of 1~2/3, wherein the first pixel electrode is a white pixel electrode, and the second pixel electrode is a red pixel electrode, a blue pixel electrode or a green pixel electrode;

wherein an area of the first ineffective display section is larger than an area of the second ineffective display section;

wherein the first ineffective display section is a section of the first pixel electrode sheltered by a black matrix, the first effective display section is a section of the first pixel electrode unsheltered by the black matrix, the second ineffective display section is a section of the second pixel electrode sheltered by the black matrix, and the second effective display section is a section of the second pixel electrode unsheltered by the black matrix;

wherein the first effective display section comprises a plurality of first wire gatings disposed separately; and the second effective display section comprises a plurality of second wire gatings disposed separately, a third connecting section connected with one end of the plurality of second wire gatings, and a fourth connecting section connected with the other end of the plurality of second wire gatings;

wherein the first ineffective display section comprises a first connecting section connected with one end of the plurality of first wire gatings, a second connecting section connected with the other end of the plurality of first wire gatings, and a first pin section connected with the second connecting section; and the second ineffective display section is a second pin section connected with the fourth connecting section;

wherein the first connecting section has a first external edge and a second external edge opposite to the first external edge; the second connecting section has a third external edge and a fourth external edge opposite to the third external edge; the first connecting section has a first extension section extending along the first connecting section from the first external edge, and is located outer a position that the outermost first wire gating located on the first external edge; the first connecting section has a second extension section extending along the first connecting section from the second external edge, and is located outer a position that the outermost first wire gating located on the second external edge; the second connecting section has a third extension section extending along the second connecting section from the third external edge, and is located outer a position that the outermost first wire gating located on the third external edge; and the second connecting section has a fourth extension section extending along the second connecting section from the fourth external edge, and is located outer a position that the outermost first wire gating located on the fourth external edge;

wherein the first extension section, the second extension section, the third extension section, and the fourth extension section are fully covered by the black matrix.

12. The display panel according to claim 11, wherein the number of the first wire gatings is less than the number of the second wire gatings, a width of the first wire gatings is larger than a width of the second wire gatings.

13. The display panel according to claim 11, wherein the actual coverage area of the first pixel electrode is a sum of the actual coverage areas of the first effective display section and the first ineffective display section; and the actual coverage area of the second pixel electrode is a sum of the actual coverage areas of the second effective display section and the second ineffective display section.

14. The display panel according to claim 11, wherein the first connecting section, the first extension section, and the second extension section are integrated into a rectangle shape.

15. The display panel according to claim 11, wherein the second connecting section, the third extension section, and the fourth extension section are integrated into a rectangle shape.

* * * * *